(12) United States Patent
Fehlhaber et al.

(10) Patent No.: US 7,129,152 B2
(45) Date of Patent: Oct. 31, 2006

(54) METHOD FOR FABRICATING A SHORT CHANNEL FIELD-EFFECT TRANSISTOR

(75) Inventors: Rodger Fehlhaber, München (DE); Helmut Tews, München (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/520,743

(22) PCT Filed: Jun. 21, 2003

(86) PCT No.: PCT/DE03/02072

§ 371 (c)(1),
(2), (4) Date: Aug. 8, 2005

(87) PCT Pub. No.: WO2004/006314

PCT Pub. Date: Jan. 15, 2004

(65) Prior Publication Data

US 2006/0094176 A1    May 4, 2006

(30) Foreign Application Priority Data

Jul. 8, 2002    (DE) ................................ 102 30 696

(51) Int. Cl.
*H01L 21/338* (2006.01)
(52) U.S. Cl. ............... 438/483; 438/736; 257/E21.444; 257/E21.453
(58) Field of Classification Search ................ 438/183, 438/736
See application file for complete search history.

(56) References Cited

U.S. PATENT DOCUMENTS

| 5,391,510 A | 2/1995 | Hsu et al. |
| 5,397,909 A | 3/1995 | Moslehi |
| 6,008,096 A | 12/1999 | Gardner et al. |
| 6,225,201 B1 | 5/2001 | Gardner et al. |
| 6,362,111 B1 * | 3/2002 | Laaksonen et al. ......... 438/725 |
| 6,946,400 B1 * | 9/2005 | Chung ........................ 438/706 |
| 2002/0076885 A1 * | 6/2002 | Chen ......................... 438/270 |
| 2006/0054991 A1 * | 3/2006 | Kuo et al. .................. 257/528 |

FOREIGN PATENT DOCUMENTS

| JP | 02 060131 A | 2/1990 |
| WO | WO 02/47146 A2 | 6/2002 |

OTHER PUBLICATIONS

XP 000648245, S.A. Abbas and I.E. Madgo, *Formation of Sub-Micron Patterns Negligible Tolerance*, pp. 2732-2738, IBM Disclosure Bulletin, vol. 26, No. 6, Nov. 1983.
Copy of International Search Report from International application number PCT/DE03/02072.
Copy of International Examination Report from International application number PCT/DE03/02072.

* cited by examiner

*Primary Examiner*—W. David Coleman
(74) *Attorney, Agent, or Firm*—Brinks Hofer Gilson & Lione

(57) ABSTRACT

A method for fabricating a short channel field-effect transistor is presented. A sublithographic gate sacrificial layer is formed, as are spacers at the side walls of the gate sacrificial layer. The gate sacrificial layer is removed to form a gate recess and a gate dielectric and a control layer are formed in the gate recess. The result is a short channel field-effect transistor with minimal fluctuations in the critical dimensions in a range below 100 nanometers.

25 Claims, 4 Drawing Sheets

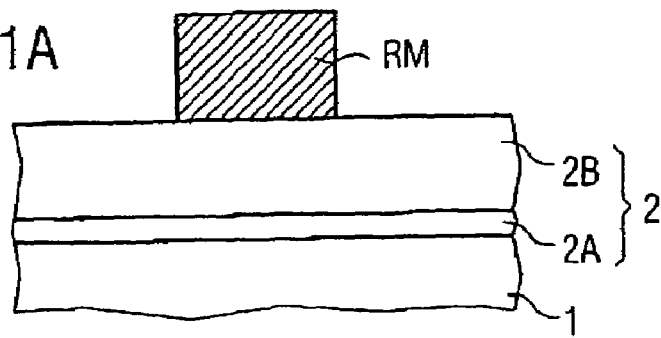
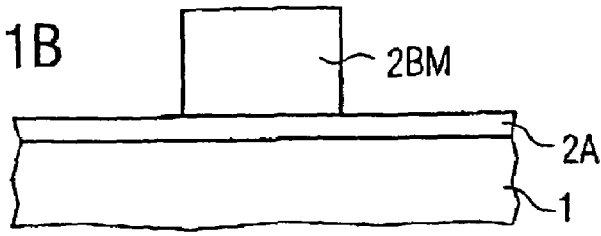
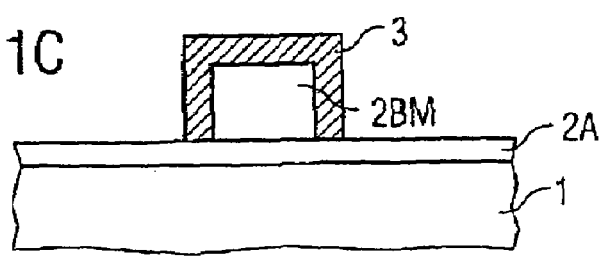
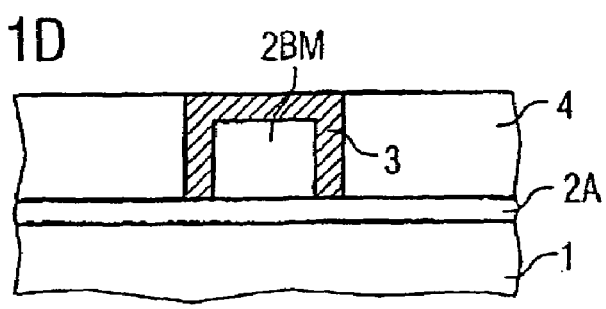
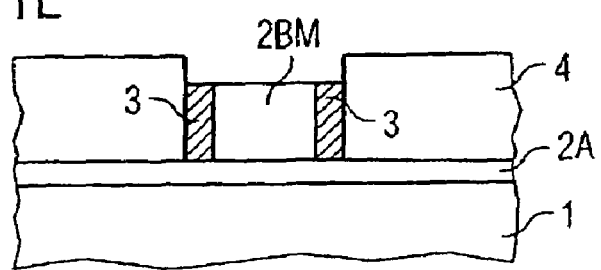

METHOD FOR FABRICATING A SHORT CHANNEL FIELD-EFFECT TRANSISTOR

This application is the national stage application of international application number PCT/DE2003/02072, filed on Jun. 21, 2003, which claims the benefit of priority to German Patent Application DE 10230696.6, filed on Jul. 8, 2002, incorporated herein by reference.

The invention relates to a method for fabricating a short channel field-effect transistor, and in particular to a method for fabricating CMOS transistors with channel lengths below 100 nanometers and minimal fluctuations in the critical dimensions.

With the increasing scale of integration of semiconductor circuits, the critical dimensions or minimal feature sizes of semiconductor components are also becoming ever smaller. In this context, in particular the control or settability of a gate length is of particular importance in what are known as field-effect transistors (FETs), since this has a significant effect on the electrical properties. A more extensive scale of integration and circuitry complexity cannot be realized without using these short channel transistors, as they are known.

As the channel length becomes shorter and shorter, however, a width of an associated gate control layer (gate stack) is usually also reduced, resulting in significant conductivity problems and therefore driving or speed problems. In recent times, to eliminate conductivity problems of this type, what are known as replacement gate methods have been used, in which a gate sacrificial layer, which usually consists of polysilicon, is deposited on the gate oxide, then patterned by means of lithography and by means of dry etching, and is removed after source/drain regions have been formed, and the resulting gate recess is filled with highly conductive materials in order to realize the actual gate.

However, the development of suitable lithography processes for the production of very fine gate structures in a sub-100-nanometer range has thrown up very major problems resulting in particular from what is known as the resist chemistry, the mask production and the complexity of the lithography system.

By way of example, in the further development of optical lithography for producing very fine structures in the 100 nanometer range, what is known as the 157 nanometer lithography has been reached. These lithography processes require new types of resist materials, yet despite very intensive efforts to date no resist has been discovered which completely satisfies the technical requirements for such small structures. Furthermore, in addition to these new materials, new processes for mask production are also required, the development of which is once again very cost-intensive. Consequently, very cost-intensive lithography systems which are difficult to implement result.

Consequently, what are known as sublithographic processes have been introduced as an alternative to conventional optical lithography processes of this type. In these sublithographic processes, by way of example, a structure is imaged on an auxiliary layer using the conventional photoresist, this auxiliary layer is anisotropically etched, the resist mask is removed, and then the auxiliary layer is etched from all sides, and thereby reduced in size, by means of an isotropic etching process. This reduced structure in the auxiliary layer then forms the desired sublithographic mask.

However, one drawback of conventional processes of this type is the fluctuations in the critical dimensions CD of the sublithographic mask, which originate mainly from resist materials used, the resist chemistry, the anisotropic etching process and the subsequent isotropic etching process. Each of these processes increases the variation in the critical dimension CD. These fluctuations in the critical dimension CD (currently typically 12 nanometers) constitute an evermore serious problem as the gate length is reduced to below 100 nm, since it is very difficult to simultaneously satisfy the requirements for a shorter gate length and a proportionally reduced CD fluctuation. Fluctuations of this nature have a considerable effect on the electrical properties of the individual transistors and of the overall circuit in the range below 100 nm.

Therefore, the invention is based on the object of providing a method for fabricating a short channel field-effect transistor in which, with minimal outlay, fluctuations in the critical dimensions or channel lengths are greatly reduced and anisotropic etching processes are reduced to a minimum.

In particular on account of a chemical conversion of at least the side walls of a first mask being carried out in order to form a sublithographic mask layer and of the further use of this chemically converted mask layer as a gate sacrificial layer, it is possible, while reducing undesired anisotropic etching processes and substantially simplifying the overall process, to greatly reduce fluctuations in the critical dimensions or channel lengths, since the chemical conversion can be achieved virtually 100% conformably with respect to a surface, and the converted gate sacrificial layer can be removed using conventional isotropic etching processes.

In addition, it is possible to form a protective layer for the sublithographic mask layer, with the etching steps carried out in subsequent lithographic processes reliably preventing the occurrence of additional fluctuations in the critical dimension.

It is preferable for the first mask layer used to be a polysilicon layer and for the chemical conversion carried out to be a wet oxidation with $H_2$ and $O_2$, resulting in a very minor fluctuation in the channel length of the field-effect transistor using standard materials and standard processes.

Furthermore, a further protective layer can be formed at the surface of the semiconductor substrate, and this further protective layer can be used as an additional etching stop layer and scattering layer during an implantation which is subsequently carried out. Both the electrical properties and the etching accuracy can be further improved as a result.

It is preferable for poly-SiGe to be deposited as sacrificial filling layer and planarized, resulting in sufficient etching selectivity with respect to the other standard materials used for the gate stack.

Furthermore, after removal of the sublithographic gate sacrificial layer, it is possible to form a spacer additional layer, thereby further improving the insulation properties for the gate or the control layer.

It is preferable for what is known as a Damascene process to be used to fill the gate recess produced, which allows the very narrow trenches to be filled with materials of excellent conductivity.

To improve the drivability of the transistors, materials with a high dielectric constant are used for the gate dielectric and materials with a high electrical conductivity are used for the control layer.

It is preferable for what is known as a silicide process (salicide process) to be carried out to realize connection layers or contacts of the source/drain regions, so that it is possible for contacts with a high conductivity to be formed in a self-aligning manner.

The invention is described in more detail below on the basis of an exemplary embodiment and with reference to the drawing, in which:

FIGS. 1A to 1P show simplified sectional views or plan views for illustrating the method according to the invention for fabricating short channel field-effect transistors, as can be used, for example, in CMOS semiconductor circuits with channel lengths of less than 100 nanometers.

Figure 1F:
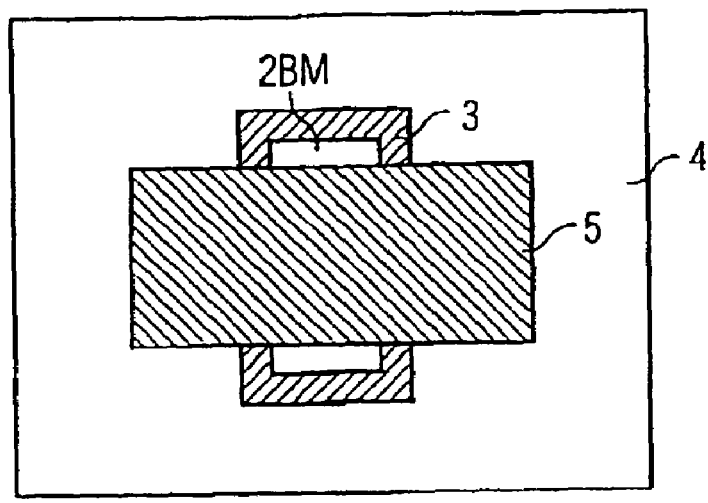
FIGS. 1A to 1P show simplified sectional views or plane views illustrating a method according to the invention for fabricating a short channel field-effect transistor.

In accordance with FIG. 1A, the semiconductor substrate 1 used is preferably monocrystalline silicon, although it is also possible to use any other desired semiconductor substrates, such as for example SOI, Ge or III–V semiconductors.

A first mask layer 2 is formed at the surface of the semiconductor substrate 1, this mask layer, by way of example, having a semiconductor material as hard-mask layer, and preferably having an amorphous or polycrystalline silicon layer 2B with a thickness of approx. 50 to 100 nanometers. The first mask layer 2 may furthermore optionally include an etching stop layer 2A which, for example, comprises an approx. 10 nanometer thick silicon nitride layer and can be used to increase the accuracy of subsequent patterning steps.

A multiplicity of lithography processes can be used for the photolithographic patterning of the first mask layer 2; in accordance with FIG. 1A, first of all a first resist layer is formed at the surface of the mask layer 2 and is then exposed and developed and finally patterned, resulting in a first resist mask RM.

Then, in accordance with FIG. 1B, the mask layer 2 is patterned using the resist mask RM; if the optional etching stop layer 2A is used, only the hard mask layer 2B above it is used to form a first mask 2BM. The process for carrying out a lithographic patterning of this type corresponds to a conventional lithographic process, and consequently no detailed description is given below.

The first mask 2BM illustrated in FIG. 1B is used, for example, to define a distance between two adjacent gates in a CMOS circuit, the dimensions of the first resist mask RM and therefore also of the first mask 2BM being significantly larger than the desired gate length or the sublithographic gate sacrificial layer which is to be formed. In a 70 nanometer technology generation, the first mask 2BM, for example, has a dimension (width) of, for example, 160 nanometers. Therefore, a lithography step of this type can be realized by means of a conventional MUV (mid-ultraviolet) lithography, with the resist side wall roughness which is then produced being of no importance to the method described below, since it has no influence on the final gate length or the sublithographic gate sacrificial layer.

Then, in accordance with FIG. 1C, the top surface and at least the side walls of the first mask 2BM are chemically converted in order to conformally form a sublithographic mask layer 3. More specifically, by way of example, a wet oxidation by means of $O_2$ and $H_2$ is carried out for approx. 20 minutes at a temperature of 900 degrees Celsius, with the result that the polysilicon side walls and the top surface of the first mask 2BM are oxidized to a thickness of, for example, 30 nanometers. This chemical conversion is in this case carried out virtually 100% conformally with respect to the top surface of the first mask 2BM, and consequently the thickness of the sublithographic mask layer 3 formed in this manner is virtually identical at every location, with scarcely any fluctuations.

In particular this chemical conversion of the first mask 2BM reliably avoids thickness fluctuations or fluctuations in the critical dimension CD which have an adverse effect on the electrical properties in semiconductor circuits, for example.

Since, furthermore, a chemical conversion of this type, such as for example an oxidation, can be controlled very accurately, thickness control or settability of the thickness of 5% or better is achieved without problems. Accordingly, the thickness of the converted top-surface or side-wall layer can be very accurately defined within a range from 5 to 50 nanometers using the process parameters, such as for example a temperature and a gas composition.

A transitional roughness between the first mask or the polysilicon layer 2BM and the sublithographic mask layer or the silicon oxide 3 can in this case be improved by using an additional amorphous silicon deposition instead of a polysilicon deposition and by nitriding carried out prior to the chemical conversion or oxidation.

In this context, it is important that any roughness or thickness fluctuation in the resist side walls and therefore the first mask 2BM has no effect on the thickness of the chemically converted sublithographic mask layer 3 or the silicon oxide. Whereas in conventional lithography processes the two side walls of the resist mask have roughnesses or fluctuations which are independent of one another, and these roughnesses lead to local fluctuations in the critical dimensions CD, the layer thickness of the chemically converted mask layer 3 is independent of resist roughnesses and/or deposition nonuniformities of this nature. Accordingly, resist roughnesses or fluctuations lead only to positioning errors in a corresponding transistor (gate), but not to a variation in a corresponding gate length and therefore channel length. Furthermore, in particular in an oxidation process, the oxide thicknesses are primarily independent of a density of respective poly structures, such as for example insulated structures or structures which are close together and each have the same oxide thicknesses.

According to a simplified embodiment (not shown), the chemical conversion used to form the sublithographic mask layer 3 can be directly followed by a lithographic patterning to remove the first mask 2BM and any parts of the sublithographic mask layer 3 which are not required, and even this results in a sublithographic gate sacrificial layer with very slight fluctuations in the critical dimensions CD.

To further improve or reduce the fluctuations in the critical dimensions CD, however, in accordance with FIG. 1D it is optionally possible for a protective layer 4 for the sublithographic mask layer to be formed prior to the lithographic patterning. More specifically, by way of example, it is possible to deposit polysilicon in order to form the protective layer 4 over the entire surface of the sublithographic mask layer 3, with the protective layer 4 then being removed again down to the mask layer 3, for example by means of a CMP (chemical mechanical polishing) process. The mask layer 3 can in this case serve as the stop layer.

In accordance with FIG. 1E, in a subsequent etching step, by way of example, the uncovered surface regions of the mask layer 3 are removed, with an oxide etch preferably being carried out in order to remove the uncovered top oxide. In this context, it is possible to use conventional wet-chemical etching processes, in which case the etching depth is equal to the oxide thickness or the thickness of the mask layer 3.

In a subsequent step, as shown in FIG. 1F, a second resist mask 5 is used as etching mask for the lithographic patterning of the sublithographic mask layer 3, and a wet-chemical or dry-chemical etch of the uncovered polysilicon and oxide regions is carried out selectively with respect to the etching stop layer 2A.

Figure 1G:
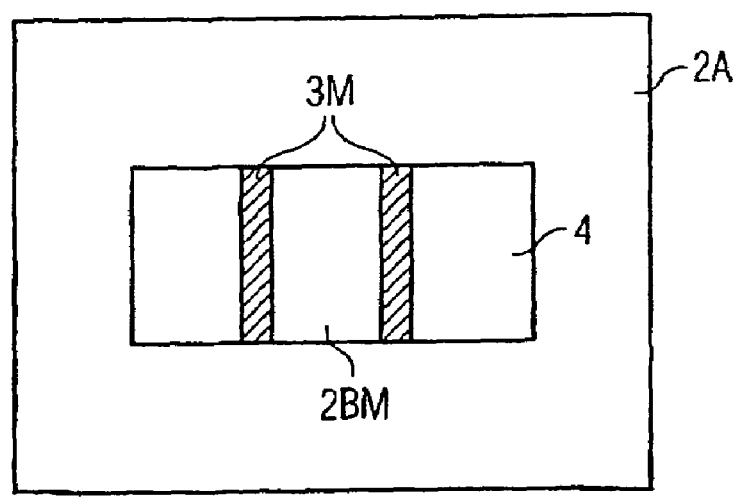

Accordingly, in accordance with the plan view illustrated in FIG. 1F, the uncovered regions of the first mask 2BM of the mask layer 3 and the protective layer 4 are removed as far as the etching stop layer 2A, resulting in the plan view illustrated in FIG. 1G after removal of the second resist mask 5. Given a suitable selection of the semiconductor substrate 1 and of the etching processes used, it is also possible to dispense with the optional etching stop layer 2A, in which case the uncovered layers are removed only as far as the semiconductor substrate 1.

Figure 1H:
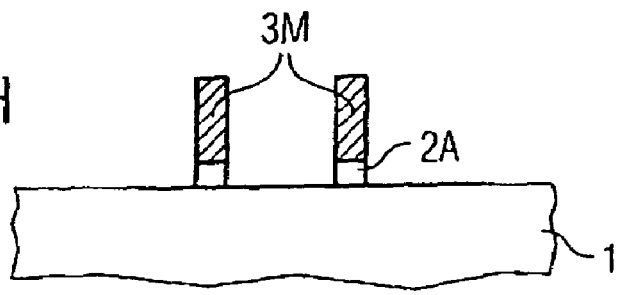

Then, in accordance with FIG. 1H, which once again represents a simplified sectional view, the polysilicon of the first mask 2BM and oiL the protective layer 4 are removed selectively with respect to the etching stop layer or silicon nitride layer 2A, and after that the etching stop layer 2A is etched away, resulting in the sublithographic gate sacrificial layer 3M, which is required for the subsequent modified gate replacement process and preferably consists of an oxide, on the semiconductor substrate 1.

It is thereby possible to realize very narrow (e.g. 30 nanometers wide) sublithographic gate sacrificial layers 3M with very minor fluctuations in the critical dimensions CD. The spacing between two sublithographic gate sacrificial layers 3M in this case corresponds to the width of the lithographic mask RM. Compared to conventional spacer techniques, the control or producibility of the critical dimensions is very much more accurate, with the result that it is even possible to realize sublithographic gate sacrificial layers with a feature size of less than 10 to 20 nanometers.

Figure 1I:
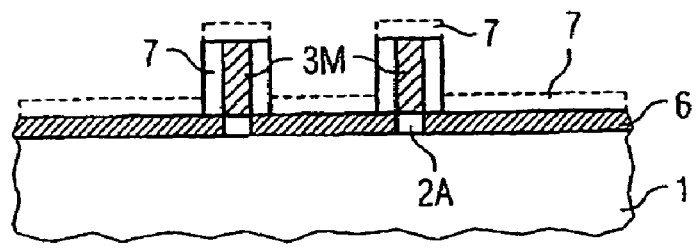

In accordance with FIG. 1I, it is optionally possible for a further protective layer 6 to be formed at the surface of the semiconductor substrate 1, this protective layer 6 substantially representing a protective layer and/or a scattering layer for, for example, a subsequent implantation step. However, this further protective layer 6, like the optionally introduced etching stop layer 2A, may also be dispensed with, in which case a corresponding etching selectivity or selection of materials is required, in particular for the semiconductor substrate 1.

Figure 1J:
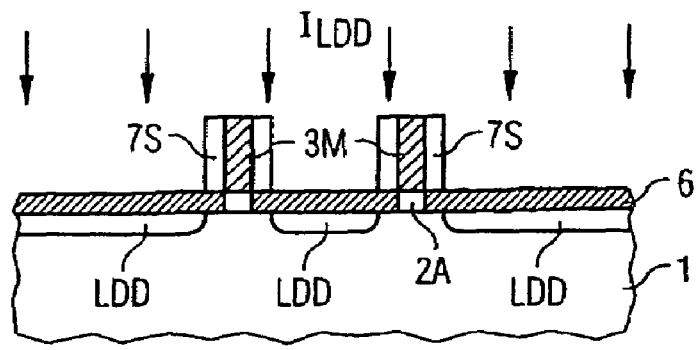

In accordance with FIG. 1I, therefore, a spacer layer 7 is deposited conformally directly on the semiconductor substrate 1 or on the optional further protective layer 6 using conventional spacer technology, for example as a silicon nitride layer, and is then etched anisotropically, resulting in the spacer structure 7S illustrated in FIG. 1J at the side walls of the sublithographic gate sacrificial layers 3M.

Figure 1K:
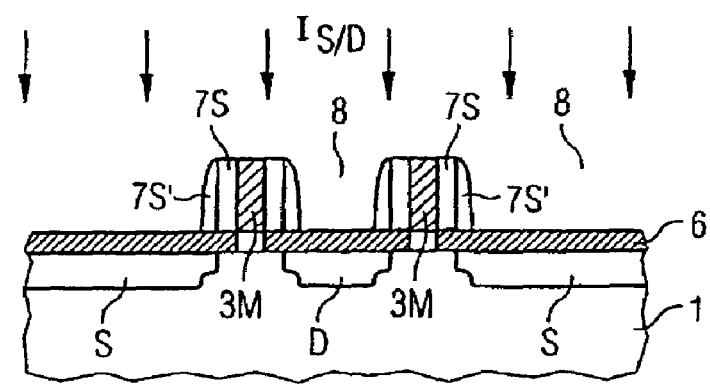

Furthermore, in accordance with FIG. 1J, connection regions LDD for source/drain regions that are subsequently to be formed are formed in a self-aligning manner in the semiconductor substrate 1, preferably by carrying out an ion implantation $I_{LDD}$ and using the spacers 7S and the gate sacrificial layer 3M as a mask. If the further protective layer 6, which consists, for example, of $SiO_2$, is present, this protective layer in this step serves as a scattering layer in order to improve a doping profile in the semiconductor substrate 1. After a second spacer layer or a second spacer 7S' has been formed analogously to spacer 7S, an implantation $I_{S/D}$ is then carried out in a self-aligned manner in accordance with FIG. 1K to form source region S and drain region D. A heat treatment, which anneals the damage caused during the ion implantation, can then be carried out in order to improve the electrical properties.

At this point, as an option to the procedure illustrated in FIGS. 1A to 1J, it is also possible to carry out contact-connection of the source/drain regions S and D, preferably using a silicide process (salicide process). If the further protective layer 6 is present, this must of course have been removed beforehand.

Figure 1L:
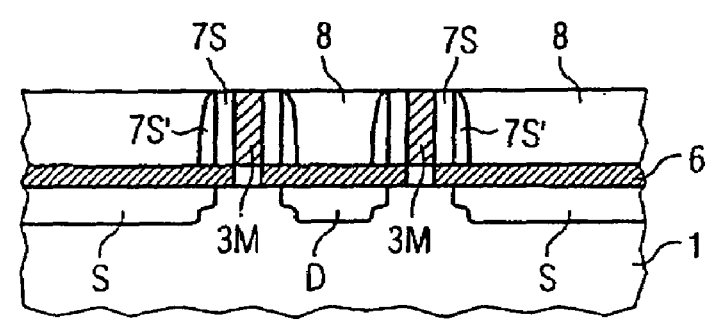

According to the present preferred exemplary embodiment, however, this contact-connection takes place at a later time, and consequently in accordance with FIG. 1L first of all a sacrificial filling layer 8 is realized in order to embed the sublithographic gate sacrificial layer 3M and the spacers 7S and 7S'. More specifically, in this case a material which can be etched selectively with respect to a gate stack formed subsequently is deposited as sacrificial filling layer 8 and planarized, for example by means of a CMP (chemical mechanical polishing) process, poly-SiGe preferably being used as sacrificial filling layer in particular for the standard materials used in silicon semiconductor manufacture. In addition to this poly-SiGe filling material, it is, of course, also possible to use other materials as the sacrificial filling layer, provided that they have a sufficient etching selectivity with respect to the finished gate stack.

Figure 1M:
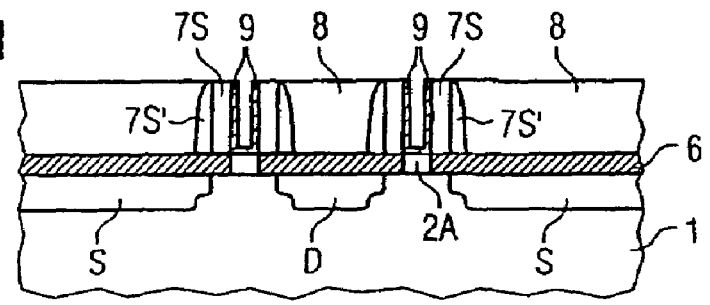

Then, in accordance with FIG. 1M, the sublithographic gate sacrificial layer 3M is removed in order to form a respective gate recess. If NFET and PFET transistors, as are customarily employed in CMOS circuits, are used, these gate recesses are preferably uncovered separately from one another by means of conventional lithographic masking. To remove the gate sacrificial layer 3M it is preferable to use wet-chemical etching processes which act selectively with respect to the sacrificial filling layer 8 and with respect to the spacers 7S and 7S'. If the above-described poly-SiGe is used for the sacrificial filling layer 8 and if a silicon nitride layer is used for the spacers 7S, it is accordingly possible for the oxide layer which serves as gate sacrificial layer 3M to be removed by means of a conventional wet-chemical oxide etching process.

In accordance with FIG. 1M, it is optionally possible for a spacer additional layer 9 to be formed at the side walls of the spacers 7S and at the semiconductor substrate 1 or the etching stop layer 2A, in which-case an oxide is formed as spacer additional layer 9, for example in a short oxidation step to convert the nitride surface of the spacers 7S and the etching stop layer 2A. This conversion of the spacers 7S is preferably carried out by means of an oxidation process in which atomic oxygen is used and an oxide layer 9 of approx. 1 to 3 nanometers can be formed.

This spacer additional layer 9 results in a further improved insulation layer for the control layer or the gate which is subsequently to be formed, thereby reliably preventing charge losses or leakage currents.

Figure 1N:
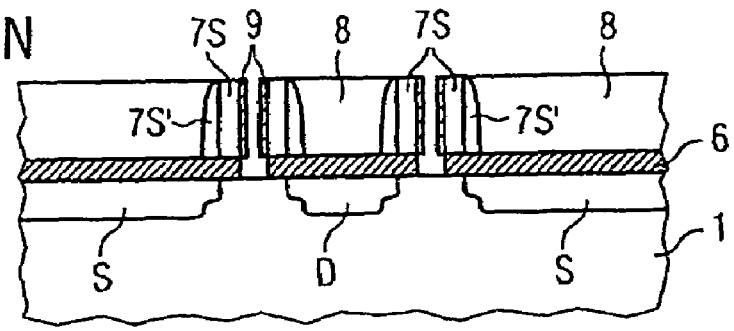
Figure 1O:
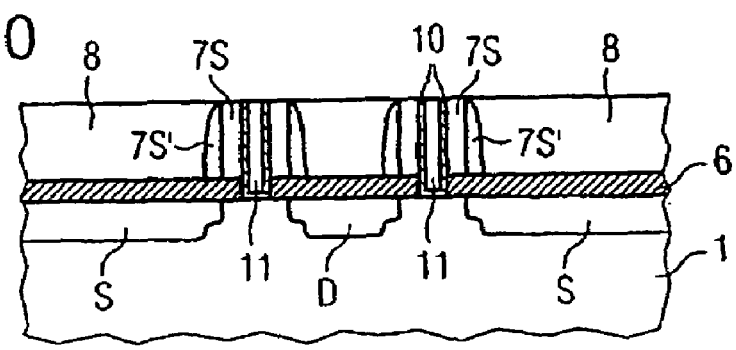

In accordance with FIG. 1N, in a subsequent step first of all the base region of the additional layer 9 is removed, by way of example by means of an oxide etch using an anisotropic etching process, such as for example reactive ion etching (RIE). If the optional etching stop layer 2A is present, the latter is also removed selectively with respect to the oxide in a nitride etch, and the semiconductor substrate 1, which preferably consists of silicon, is uncovered at the surface in its gate region. In this way, a gate recess is formed all the way down to the semiconductor substrate 1, and a gate dielectric and the sub-100 nanometer gate stack which is actually to be formed are subsequently produced in this gate recess.

It is preferable to use what is known as a Damascene process, as is used in the production of interconnects or metallization levels, to be used to realize this gate stack and/or to fill the gate recess. In this case, it is possible to form diffusion barrier layers and/or seed layers as gate dielectrics, thereby allowing or simplifying subsequent growth of metallic layers, such as for example a Cu layer. To level these trench filling layers, by way of example the layer sequence which remains above the trench is removed and contact-connected by means of a CMP (chemical mechanical polishing) process.

In this way, it is possible to reliably fill even very finely patterned gate recesses in the sub-100 nanometer range and to reliably prevent grain size, electromigration and conductivity problems which usually arise within the filling layers.

In accordance with FIG. 10, it is preferable for materials with a high dielectric constant, i.e. what are known a high-k materials, to be formed at the entire surface of the gate recess or the additional layer 9 as gate dielectric 10 in order to realize gate insulation layers. However, in principle it is also sufficient for a layer of this type to be formed only at the base surface of the gate recess, in which case, for example, oxidation processes for oxidizing the surface of the semiconductor substrate 1 may also be considered. After the gate dielectric 10 has been formed, the remaining gate recess is formed with an electrically conductive material to realize a control layer 11 or the actual gate. In this context, it is preferable to use materials with a high electrical conductivity, so that the problems which arise in particular with sub-100 nanometer structures with regard to sufficient conductivity can be compensated for.

When realizing CMOS circuits, it is possible, for example, to use doped semiconductor materials as well as metallic materials, such as for example TaN, Ir, RuO, for PFET transistors and NFET transistors formed separately from one another. In particular, in-situ boron-doped polysilicon can be used for PFET transistors, in which case a thin film of boron-doped SiGe followed by polysilicon also allows excellent electrical properties to be achieved for a corresponding transistor. On the other hand, in-situ arsenic- or phosphorus-doped polysilicon can be recommended for NFET transistors. In this context, it should in principle be noted that suitable materials are used to match the work functions and/or to define respective threshold voltages of the respective transistors, a multilayer structure having a layer for matching the work function and a further layer for realizing the required high conductivity also being conceivable. Finally, a planarization is carried out using the CMP process described above.

Figure 1P:
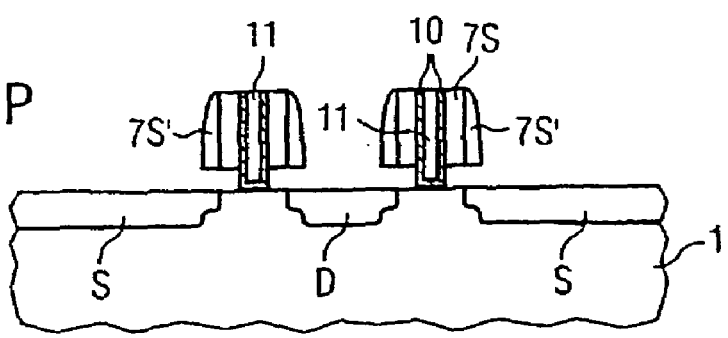

In accordance with FIG. 1P, in a further method step the sacrificial filling layer 8, which preferably consists of an SiGe filling layer, is then removed selectively with respect to the gate stack or with respect to the materials used in this context, preferably by carrying out a wet-chemical etch. If it is present, the optional further protective layer 6 is also removed at this time and the surface of the semiconductor substrate or of the source/drain regions is thereby uncovered.

Although contact-connection of the source/drain regions S and D, as has already been described above, may also take place at an earlier time, a corresponding contact-connection is preferably carried out at this time, preferably by carrying out a silicide process.

To further improve the electrical conductivities of the source/drain regions S and D and/or to realize highly conductive connection regions, it is accordingly first of all possible to deposit silicidable material or a silicidable metal layer, such as for example cobalt, nickel or platinum, over the entire surface. Then, the crystalline surface layer of the semiconductor substrate 1 is converted using the silicidable material to form highly conductive connection regions 12; no silicide (salicide) is formed at the surfaces of this material which are not in contact in the semiconductor material (silicon), but rather the deposited material (metal) remains in place, with the result that once again a selective etchback of the deposited layer can be carried out by means of a preferably wet-chemical etching process. In this way, a large number of patterning steps for forming the connection regions can be carried out using just one etching chamber, thereby reducing the fabrication costs.

If cobalt, nickel or platinum is used, the result is self-aligned, highly conductive connection regions 12 of cobalt, nickel or platinum silicide layers.

If the top layer of the gate stack consists of poly-Si, it is also possible for a silicide layer 14 to be formed on the gate stack.

Figure 1Q:
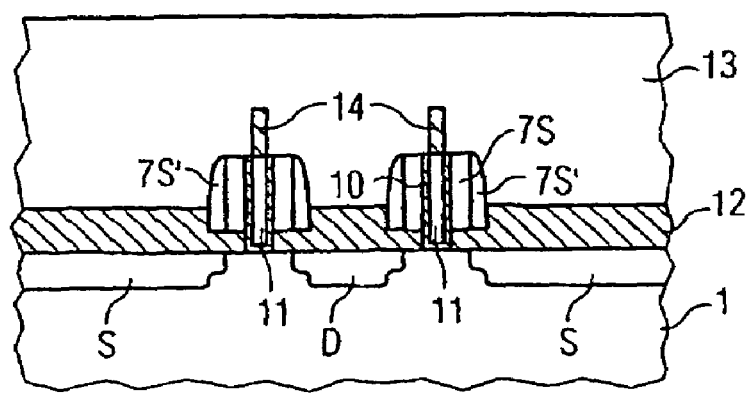

Finally, in accordance with FIG. 1Q, an insulation layer 13 is formed in order to level the semiconductor surface, with the regions located between the gate stacks preferably being filled with oxide, such as for example HDP (high density plasma oxide) or BPSG (borophosphosilicate glass).

In this way, it is possible to realize short channel field-effect transistors with a very short gate length and very minor fluctuations in the critical dimensions in a simple way. Furthermore, the method according to the invention allows the use of optimized materials for NFET and PFET gate stacks. Furthermore, the number of anisotropic etching steps usually required can be reduced.

The invention has been described on the basis of a polysilicon layer for a mask layer, an oxidation conversion of the mask layer, a nitride layer as etching stop layer and an SiGe-poly layer as sacrificial filling layer. However, the invention is not restricted to these layer materials, but rather equally encompasses layer materials which have similar properties. In particular, the oxide gate sacrificial layer described above may also be realized by oxidation of, for example, different hard mask layers or a chemical conversion of a deposited layer, such as for example a deposited oxide or various deposited layers.

The invention claimed is:

1. A method for fabricating a short channel field-effect transistor, comprising the steps of:
   a) preparing a semiconductor substrate;
   b) forming a first mask layer at a surface of the semiconductor substrate;
   c) lithographically patterning the first mask layer to form a first mask with substantially perpendicular side walls;
   d) carrying out a chemical conversion of at least one side wall of the first mask to form a sublithographic mask layer;
   e) lithographically patterning the sublithographic mask layer to form a sublithographic gate sacrificial layer;
   f) removing the first mask;
   g) forming spacers at side walls of the sublithographic gate sacrificial layer;
   h) forming at least one of connection regions and source/drain regions in the semiconductor substrate;
   i) forming a sacrificial filling layer to embed the sublithographic gate sacrificial layer and the spacers;
   j) removing the sublithographic gate sacrificial layer to form a gate recess;
   k) forming a gate dielectric in the gate recess;
   l) forming a control layer in the gate recess;
   m) removing the sacrificial filling layer in order to uncover the source/drain regions;
   n) forming connection layers for the source/drain regions; and
   o) forming an insulation layer in order to level a semiconductor surface.

2. The method as claimed in claim 1, further comprising the steps of:
   e1) forming a protective layer for the sublithographic mask layer before step e); and
   e2) removing the protective layer after step e).

3. The method as claimed in claim 2, wherein in step e1) the protective layer is formed over the entire surface of the sublithographic mask layer and is then caused to recede as far as the sublithographic mask layer.

4. The method as claimed in claim 1, wherein in step d) a conformal conversion of the side walls of the first mask is carried out over a thickness range of from 5 to 50 nanometers.

5. The method as claimed in claim 1, wherein the first mask layer includes a semiconductor material, and the chemical conversion in step d) represents an oxidation of the semiconductor material.

6. The method as claimed in claim 5, wherein in step d) a wet oxidation with $H_2$ and $O_2$ is carried out.

7. The method as claimed in claim 1, wherein in step b):
   b1) a first resist layer is formed at a surface of the mask layer;
   and in step c):
   c1) the resist layer is lithographically patterned in order to form a first resist mask; and
   c2) the mask layer is patterned using the first resist mask.

8. The method as claimed in claim 1, wherein the mask layer includes an etching stop layer, and in step e) a second resist mask is used as an etching mask.

9. The method as claimed in claim 8, wherein the first mask layer includes a polysilicon layer and a silicon nitride layer.

10. The method as claimed in claim 1, wherein before step g) a protective layer is formed at the surface of the semiconductor substrate, and in step m) the protective layer is removed.

11. The method as claimed in claim 1, wherein in step g) a conformal $Si_3N_4$ layer is formed and etched anisotropically.

12. The method as claimed in claim 1, wherein in step h) an ion implantation with subsequent heat treatment is carried out.

13. The method as claimed in claim 1, wherein step h) is carried out after step m).

14. The method as claimed in claim 1, wherein in step i) poly-SiGe is deposited as the sacrificial filling layer and planarized.

15. The method as claimed in claim 1, wherein in step j) the gate sacrificial layer is removed selectively with respect to the sacrificial filling layer and with respect to the spacers by wet-chemical means.

16. The method as claimed in claim 1, wherein in step j) the following additional steps are carried out:
   j1) forming a spacer additional layer, and
   j2) removing a base region of the spacer additional layer.

17. The method as claimed in claim 16, wherein in step j1) conversion of the spacers is carried out at surfaces of the spacers using atomic oxygen.

18. The method as claimed in claim 8, wherein in step j) the etching stop layer is removed in order to uncover the semiconductor substrate.

19. The method as claimed in claim 1, wherein steps k) and l) for filling the gate recess are realized by means of a Damascene process.

20. The method as claimed in claim 1, wherein in step k) materials with a high dielectric constant are used as the gate dielectric.

21. The method as claimed in claim 1, wherein in step l) materials with a high electrical conductivity are used as the control layer.

22. The method as claimed in claim 1, wherein in step n) a silicide process is carried out.

23. The method as claimed in claim 1, wherein step n) is carried out after step h).

24. The method as claimed in claim 1, wherein the transistor is a PFET and the control layer includes at least one of: in-situ boron-doped polysilicon and a thin film of boron-doped SiGe followed by polysilicon.

25. The method as claimed in claim 1, wherein the transistor is an NFET and the control layer includes in-situ arsenic- or phosphorus-doped polysilicon.

* * * * *